(12) United States Patent
Ho et al.

(10) Patent No.: US 9,653,300 B2
(45) Date of Patent: May 16, 2017

(54) STRUCTURE OF METAL GATE STRUCTURE AND MANUFACTURING METHOD OF THE SAME

(71) Applicant: UNITED MICROELECTRONICS CORP., Hsin-Chu (TW)

(72) Inventors: Nien-Ting Ho, Tainan (TW);
Chien-Hao Chen, Yunlin County (TW);
Hsin-Fu Huang, Tainan (TW);
Chi-Yuan Sun, Yunlin County (TW);
Wei-Yu Chen, Tainan (TW);
Min-Chuan Tsai, New Taipei (TW);
Tsun-Min Cheng, Changhua County (TW); Chi-Mao Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 273 days.

(21) Appl. No.: 13/864,218

(22) Filed: Apr. 16, 2013

(65) Prior Publication Data
US 2014/0306273 A1  Oct. 16, 2014

(51) Int. Cl.
| | |
|---|---|
| *H01L 27/148* | (2006.01) |
| *H01L 21/28* | (2006.01) |
| *H01L 29/49* | (2006.01) |
| *H01L 21/8238* | (2006.01) |
| *H01L 29/51* | (2006.01) |
| *H01L 29/66* | (2006.01) |
| *H01L 29/78* | (2006.01) |
| *H01L 29/165* | (2006.01) |

(52) U.S. Cl.
CPC .......... *H01L 21/28088* (2013.01); *H01L 21/823842* (2013.01); *H01L 29/4966* (2013.01); *H01L 29/517* (2013.01); *H01L 29/6659* (2013.01); *H01L 29/66545* (2013.01); *H01L 29/165* (2013.01); *H01L 29/513* (2013.01); *H01L 29/665* (2013.01); *H01L 29/7843* (2013.01); *H01L 29/7848* (2013.01)

(58) Field of Classification Search
CPC ....... H01L 21/823842; H01L 21/28088; H01L 29/4966; H01L 29/517; H01L 29/66545; H01L 29/6659; H01L 29/513; H01L 29/665; H01L 29/7843; H01L 29/7848; H01L 29/165
See application file for complete search history.

(56) References Cited

U.S. PATENT DOCUMENTS

| | | | |
|---|---|---|---|
| 6,066,533 | A | 5/2000 | Yu |
| 6,492,217 | B1 | 12/2002 | Bai |
| 6,552,377 | B1 | 4/2003 | Yu |

(Continued)

OTHER PUBLICATIONS

Wang et al., Title: Manufacturing Method for Metal Gate, pending U.S. Appl. No. 13/164,781, filed Jun. 21, 2011.

*Primary Examiner* — Victor A Mandala
*Assistant Examiner* — Colleen E Snow
(74) *Attorney, Agent, or Firm* — Winston Hsu; Scott Margo

(57) ABSTRACT

A manufacturing method of a metal gate structure is provided. First, a substrate covered by an interlayer dielectric is provided. A gate trench is formed in the interlayer dielectric, wherein a gate dielectric layer is formed in the gate trench. A silicon-containing work function layer is formed on the gate dielectric layer in the gate trench. Finally, the gate trench is filled up with a conductive metal layer.

7 Claims, 5 Drawing Sheets

(56) References Cited

U.S. PATENT DOCUMENTS

| | | |
|---|---|---|
| 6,696,345 B2 | 2/2004 | Chau |
| 6,790,719 B1 | 9/2004 | Adetutu |
| 6,794,234 B2 | 9/2004 | Polishchuk |
| 6,902,969 B2 | 6/2005 | Adetutu |
| 6,921,711 B2 | 7/2005 | Cabral, Jr. |
| 7,030,430 B2 | 4/2006 | Doczy |
| 7,074,664 B1 | 7/2006 | White |
| 7,109,079 B2 | 9/2006 | Schaeffer, III |
| 7,126,199 B2 | 10/2006 | Doczy |
| 7,157,378 B2 | 1/2007 | Brask |
| 7,193,893 B2 | 3/2007 | Forbes |
| 7,208,366 B2 | 4/2007 | Tsai |
| 7,381,619 B2 | 6/2008 | Wang |
| 7,390,709 B2 | 6/2008 | Doczy |
| 7,488,656 B2 | 2/2009 | Cartier |
| 7,785,958 B2 | 8/2010 | Doczy |
| 2002/0127888 A1 | 9/2002 | Cho |
| 2005/0095763 A1 | 5/2005 | Samavedam |
| 2005/0202659 A1 | 9/2005 | Li |
| 2005/0260347 A1* | 11/2005 | Narwankar ............ C23C 16/401 427/248.1 |
| 2005/0275035 A1 | 12/2005 | Mathew |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0148838 A1 | 6/2007 | Doris |
| 2007/0187831 A1* | 8/2007 | Ahn ........................ C23C 16/30 257/761 |
| 2007/0210354 A1 | 9/2007 | Nabatame |
| 2008/0076216 A1 | 3/2008 | Pae |
| 2008/0318371 A1 | 12/2008 | Lin |
| 2009/0057787 A1 | 3/2009 | Matsuki |
| 2009/0166769 A1 | 7/2009 | Metz |
| 2009/0230479 A1* | 9/2009 | Hsu ................. H01L 21/823842 257/369 |
| 2010/0052074 A1 | 3/2010 | Lin |
| 2010/0068877 A1 | 3/2010 | Yeh |
| 2010/0081262 A1 | 4/2010 | Lim |
| 2010/0301427 A1* | 12/2010 | Lenski .............. H01L 21/28088 257/392 |
| 2011/0018073 A1* | 1/2011 | Wang ................ H01L 21/28088 257/411 |
| 2011/0127589 A1* | 6/2011 | Chen ..................... H01L 29/495 257/288 |
| 2011/0210405 A1* | 9/2011 | Nakagawa ........... C23C 14/0641 257/411 |

\* cited by examiner

STRUCTURE OF METAL GATE STRUCTURE AND MANUFACTURING METHOD OF THE SAME

BACKGROUND OF THE INVENTION

1. Field of the Invention

The invention relates to a metal gate structure and a manufacturing method thereof, and more particularly, to a metal gate structure and a manufacturing method thereof integrating a gate last process.

2. Description of the Prior Art

With the trend towards scaling down the size of the semiconductor devices, conventional methods, which are used to achieve optimization, such as reducing thickness of the gate dielectric layer, like reducing the thickness of silicon dioxide layer for example, face problems such as current leakage due to the tunneling effect. In order to keep progressing to the next generation products, high dielectric constant (hereinafter abbreviated as high-k) materials are used to replace the conventional silicon oxide or oxynitride layer to serve as the gate dielectric layer, because they can decrease the physical limit thickness effectively, reduce the current leakage, and achieve equivalent capacities for identical equivalent oxide thicknesses (EOT).

On the other hand, the conventional polysilicon gates also face problems such as inferior performances due to boron penetration and unavoidable depletion effect, which increases the equivalent thickness of the gate dielectric layer, reduces the gate capacitance, and decrease a driving force of the devices. Thus work function metals are developed to replace the conventional polysilicon gates to be the control electrodes that are suitable to be the high-K gate dielectric layer.

However, there is always a continuous need in the semiconductor processing art to develop semiconductor device that render superior performances and reliability, such as ensuring that the metal gate of the P-type MOS (PMOS) has a work function of about 1.9 eV to 5.2 eV when the EOT of the high-K gate dielectric layer is reduced, even though the conventional silicon dioxide or silicon oxynitride gate dielectric layer is replaced by a high-K gate dielectric layer and the conventional polysilicon gate is replaced by a metal gate.

SUMMARY OF THE INVENTION

One objective of the present invention is to provide a metal gate structure and a manufacturing method thereof which may be used to adjust the work function of a metal gate to a desired value in a P-type semiconductor device.

According to one preferred embodiment of the present invention, a metal gate structure is provided. The metal gate structure includes a substrate, a gate trench, a gate dielectric layer, a silicon-containing work function layer, and a conductive metal layer. The substrate is covered by an interlayer dielectric layer having the gate trench. The gate dielectric layer, the silicon-containing work function layer, and the conductive metal layer are disposed sequentially on the substrate in the gate trench. The conductive metal layer fills up the gate trench.

According to another preferred embodiment of the present invention, a manufacturing method of a metal gate structure is provided. The manufacturing method includes the following steps. First, a substrate covered by an interlayer dielectric is provided. A gate trench is formed in the interlayer dielectric, wherein a gate dielectric layer is formed in the gate trench. A silicon-containing work function layer is formed on the gate dielectric layer in the gate trench. Finally, the gate trench is filled up with a conductive metal layer.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Figure 1:
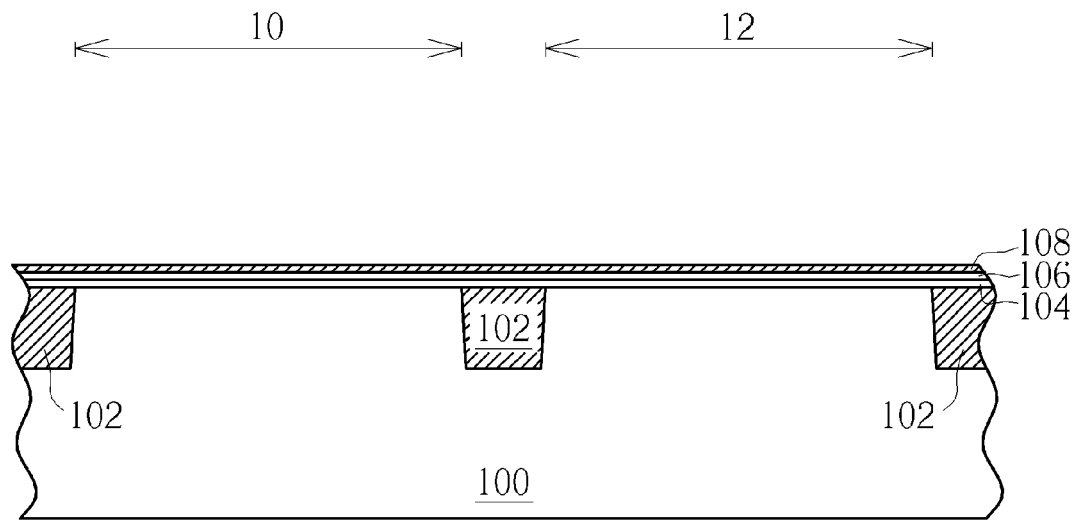
FIG. 1 to FIG. 10 are drawings illustrating a manufacturing method for metal gates of a semiconductor device.

Please refer to FIG. 1 to FIG. 10, which illustrate a method for fabricating a semiconductor device having a metal gate according to a preferred embodiment of the present invention. In this embodiment, the semiconductor device is preferably a CMOS transistor and the method preferably utilizes a gate-last approach accompanying a high-k first fabrication. As shown in FIG. 1, a substrate 100, such as a silicon substrate or a silicon-on-insulator (SOI) substrate is provided. A first region 10 and a second region 12 are defined on the substrate 100, such as an NMOS region and a PMOS region. A plurality of shallow trench isolations (STI) 102 is formed in the substrate 100 for electrically separating two adjacent regions.

An interfacial layer 104 composed of dielectric materials such as oxides or nitrides is optionally formed on the surface of the substrate 100, and a stack film composed of a gate dielectric layer 106 and a barrier layer 108 is formed on the interfacial layer 104. In this embodiment, the gate dielectric layer 106 could be a single-layer or a multi-layer structure containing a metal oxide layer such as a rare earth metal oxide, in which the dielectric constant of the gate dielectric layer 106 is substantially greater than 20. As an example, the gate dielectric layer 106 could be selected from the group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAoO), tantalum oxide ($Ta_2O_3$), zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Preferably, the barrier layer 108 is composed of TiN.

Figure 2:
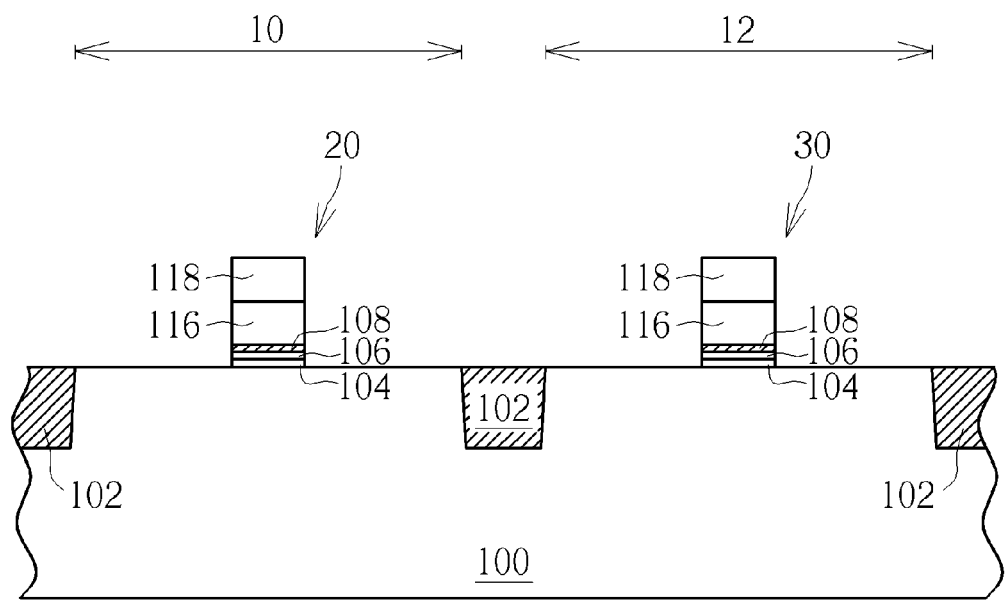

As shown in FIG. 2, a sacrificial layer (not shown), such as a polysilicon layer, and a hard mask layer (not shown) are formed in sequence on the surface of the barrier layer 108. Then, a pattern transfer is performed by using a patterned photoresist (not shown) as a mask to partially remove the hard mask layer, the sacrificial layer, the barrier layer 108, the gate dielectric layer 106, and the interfacial layer 104 through single or multiple etching processes to therefore form a patterned sacrificial layer 116 and a patterned hard mask layer 118 on the substrate 100. After stripping the patterned resist, a first stack structure 20 and a second stack structure 30, which serve as a dummy gate or replacement gate structures, are formed in the first region 10 and the second region 12 respectively. Preferably, the sacrificial layer could be composed of undoped polysilicon, polysilicon having N+ dopants, and/or amorphous polysilicon material. The hard mask could be composed of $SiO_2$, SiN, SiC, and/or SiON.

Figure 3:
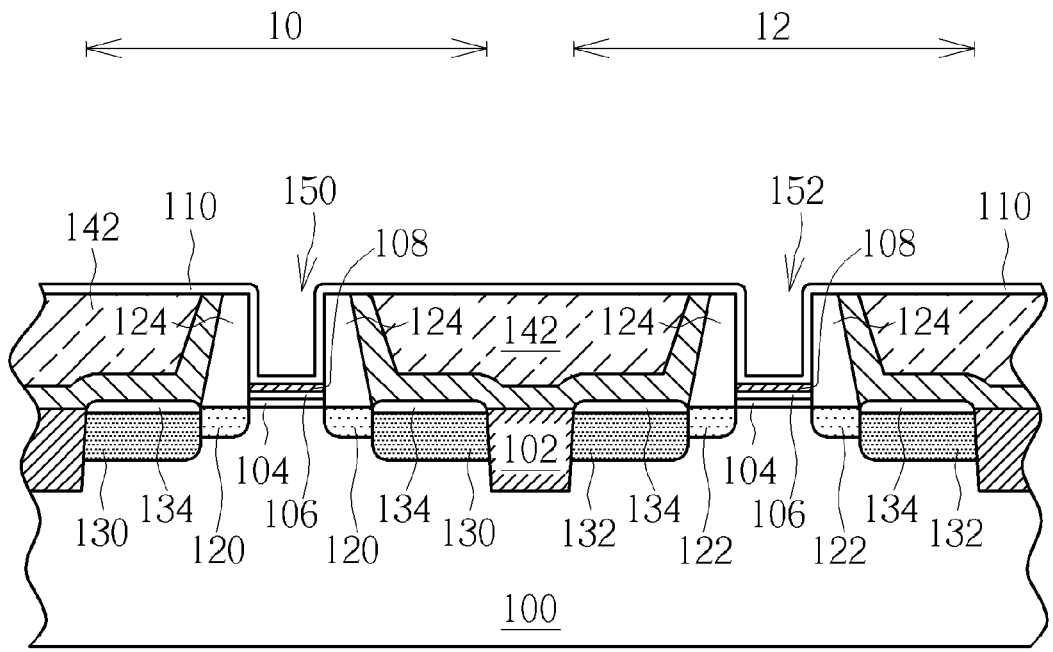

As shown in FIG. 3, spacers 124 are respectively formed on each sidewall of the first stack structure 20 and the second stack structure 30, and a lightly doped drain and source/drain are formed in the substrate 100 adjacent to two sides of the spacer 124. To put it more concretely, a first lightly doped drain 120 and a first source/drain 130 having a first conductivity type, such as P-type, are formed in the first region 10, while a second lightly doped drain 122 and a second source/drain 132 having a second conductivity type, such as N-type, are formed in the second region 12.

A selective epitaxial growth (SEG) process is optionally carried out, so as to respectively form epitaxial layers (not shown) in the substrate 100 adjacent to two sides of the spacer 124 within the first region 10 and/or the second region 12 so that they can induce predetermined compressive stress or tensile stress to the carrier channel. In this embodiment, the composition of the epitaxial layer in the first region 10 may include silicon germanium (SiGe), while the composition of the epitaxial layer in the second region 12 may include silicon phosphorous (SiP) or silicon carbide (SiC). The above-mentioned epitaxial layers may respectively have a single-layered or multi-layered structure. Moreover, despite the selective epitaxial growth process for the epitaxial layer of the present embodiment being conducted after the formation of the source/drain 130 and 132, the selective epitaxial growth process could also be performed before the source/drain 130 and 132 are formed.

Then, a silicidation process is performed by first forming a metal layer (not shown) which is selected from a group consisting of cobalt, titanium, nickel, platinum, palladium, and molybdenum on the substrate 100 to cover the source/drain 130 and 132, and then using at least one rapid thermal anneal process to have the metal react with the source/drain 130 and 132 for forming silicide layers 134 respectively on the surface of the substrate 100 in the first region 10 and the second region 12. The un-reacted metal layer is removed thereafter. It is worth noting that the timing for performing the silicidation process is not limited to this, it may also be carried out after the subsequent process for forming the source/drain contact holes and exposing the source/drain.

Then, a contact etch stop layer 140 and an interlayer dielectric 142 are formed on the surface of the substrate 100 in sequence to cover both the first stack structure 20 and the second stack structure 30. The contact etch stop layer 140 may have a suitable stress so as to increase the mobility of the carriers. A planarizing process, such as a chemical mechanical polishing (CMP) and/or etching process is then performed to partially remove the interlayer dielectric 142, the contact etch stop layer 140, and the hard mask layer 118 until the patterned sacrificial layer 116 is exposed. An etching process is carried out thereafter to remove the patterned sacrificial layer 116 from both the first region 10 and second region 12 to form a first gate trench 150 and a second gate trench 152 in the interlayer dielectric 142 within the first region 10 and the second region 12 respectively.

It should be noted that since the surface of the gate dielectric layer 103 is covered by the barrier layer 108, the gate dielectric layer 106 will not be etched or removed during the above etching process. Finally, an etch stop layer 110 is formed optionally so as to entirely and conformally cover the inner surface of the first gate trench 150 and the second gate trench 152. The composition of the etch stop layer 110 preferably differs from that of the barrier layer 108. For example, it may be tantalum nitride (TaN), but not limited thereto.

Figure 4:
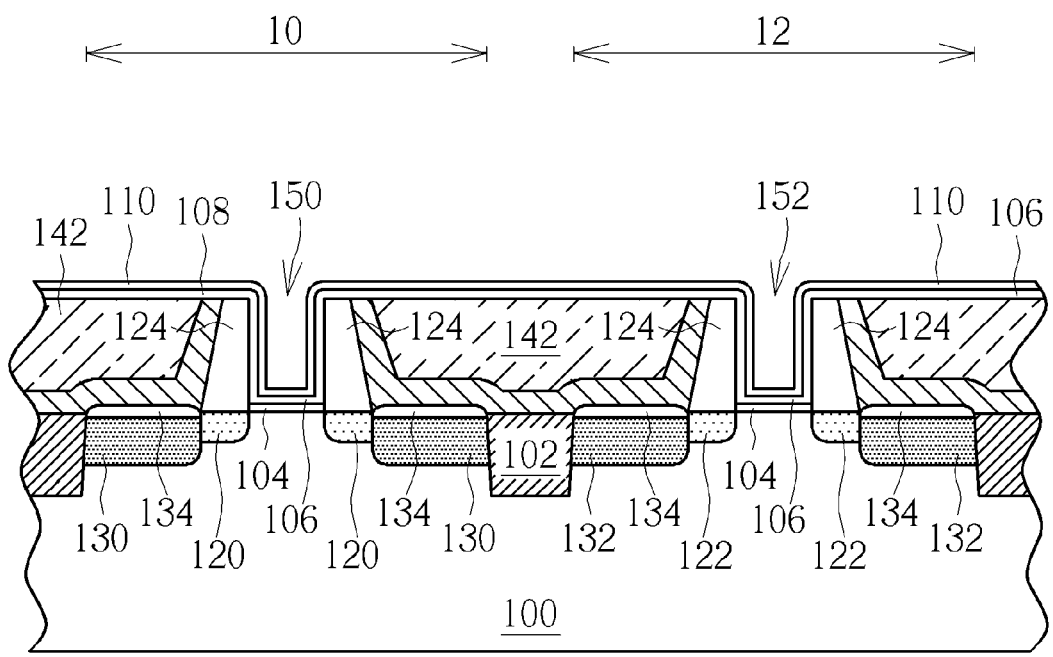

Please refer to FIG. 4. FIG. 4 is a drawing illustrating a modification of the preferred embodiment. As shown in FIG. 4, the modification is integrated in the high-k last process. To put it more concretely, a gate dielectric layer and a barrier layer are not formed before the formation of a first stack structure (not shown) and a second stack structure (not shown). That is to say, the first stack structure and the second stack structure in the initial fabrication stage do not include the gate dielectric layer and the barrier layer. According to this embodiment, after removing the gate sacrificial layer (not shown) to form the first gate trench 150 and the second gate trench 152, the interfacial layer 104 is exposed from the bottom of the first gate trench 150 and the second gate trench 152, wherein the interfacial layer 104 may include a conventional $SiO_2$ layer. Then, a gate dielectric layer 106 is formed on the substrate 100. The gate dielectric layer 106 includes high-k materials as mentioned above. As shown in FIG. 4, the gate dielectric layer 106 formed in the first gate trench 150 and the second gate trench 152 respectively has a U shape and covers the bottoms and sidewalls of the first gate trench 150 and the second gate trench 152. After forming the gate dielectric layer 106, the etch stop layer 110 is also formed on the gate dielectric layer 106 as disclosed in the previous embodiment.

Figure 5:
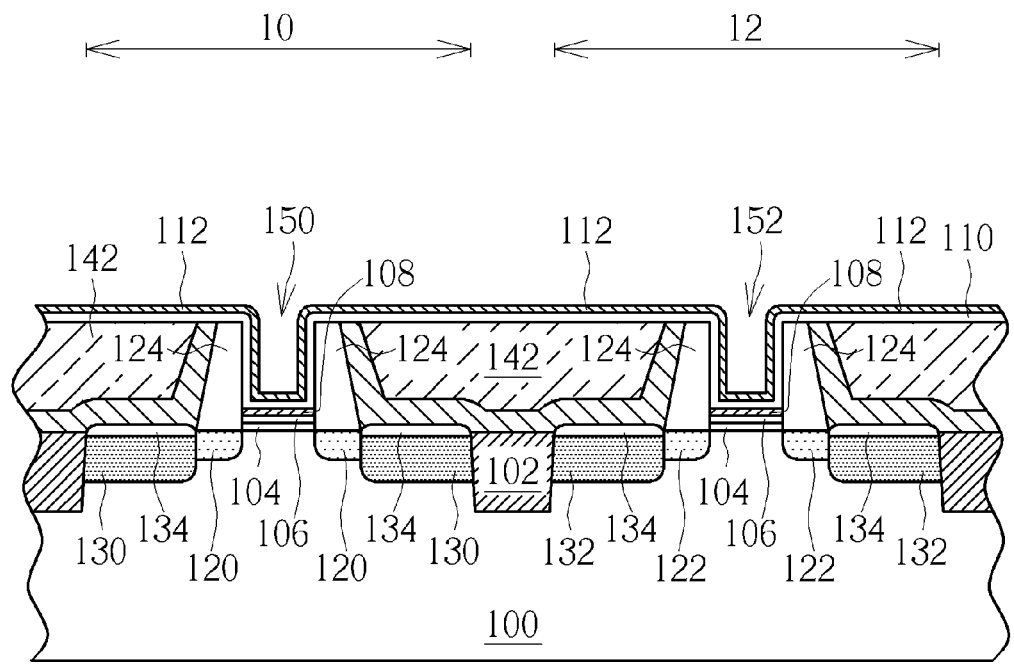

Subsequently, please refer to FIG. 5. A first work function layer 112 is formed to conformally cover the interlayer dielectric 142 and the bottom and the sidewalls of the gate trench 150 and 152. The first work function layer 112 preferably includes a vertical portion and a horizontal portion respectively on the sidewall and the bottom of each gate trench. It is worth noting that since the composition of the first work function layer 112 according to this embodiment includes silicon atoms, it can also be called a silicon-containing work function layer. To put it more concretely, the composition of the silicon-containing work function layer includes titanium, silicon and nitrogen, or further includes oxygen and other atoms.

Preferably, the first work function layer 112 may be formed through an atomic layer deposition (ALD) process, which may include a plurality of cyclic processes, i.e. adsorption-purge-adsorption-purge. For example, in a case of a composition of the first work function layer 112 that includes titanium, silicon and nitrogen, each cyclic process may correspond to the steps of providing titanium precursor-providing purge gas-providing silicon precursor and nitrogen precursor-providing purge gas. In this way, the titanium precursor, such as titanium chloride ($TiCl_4$), and the silicon precursor, such as silane ($SiH_4$), can be provided alternately to the substrate 100 and can conformally cover the bottom and the sidewalls of each gate trench 150 and 152. Additionally, the above processes may further include a thermal process and a plasma process in order to increase the reactivity of compounds.

In addition to the above-mentioned ALD process, the first work function layer 112 may be formed through other suitable methods, such as gas phase diffusion, ion implantation, solid phase diffusion, or the combination of these methods. For example, a silicon layer, such as polycrystalline silicon or amorphous silicon, and a titanium layer may be first formed on the bottom and sidewalls of each gate trench 150 and 152. A thermal process may be carried out afterward so that silicon atoms and/or titanium atoms may diffuse outwardly and a titanium silicide layer is formed.

Finally, a phase diffusion process or an ion implantation process may be carried out to respectively let nitrogen atoms freely diffuse or implant into the silicide layer.

Preferably, the work function of the silicon-containing work function layer is greater than 4.9 electron volts (eV). The atomic ratio of titanium to silicon in the silicon-containing work function layer is between 1.5 and 4 and the atomic percentage of silicon in the silicon-containing work function layer is between 10% and 30%. In a case wherein the composition of the silicon-containing work function layer includes titanium, silicon, nitrogen, and oxygen, the atomic ratio among titanium, silicon, nitrogen, and oxygen is 28.9:13.2:46.8:10. The first work function layer 112 may be selected from other metal compounds doped with silicon. The metal compounds for example may include titanium nitride (TiN), titanium carbide (TiC), tantalum nitride (TaN), tantalum carbide (TaC), tungsten carbide (WC), or aluminum titanium nitride (TiAlN), but is not limited thereto.

One feature of the present invention is that the work function of a P-type work function layer is adjusted by silicon dopants. Compared with the method which uses nitrogen or oxygen to adjust the work function of a P-type work function layer, the silicon-containing work function layer can improve the electrical performances of the transistor device, such as increasing the flat bend voltage ($V_{fb}$) and decreasing the EOT, without increasing the gate leakage current ($J_g$).

Figure 6:
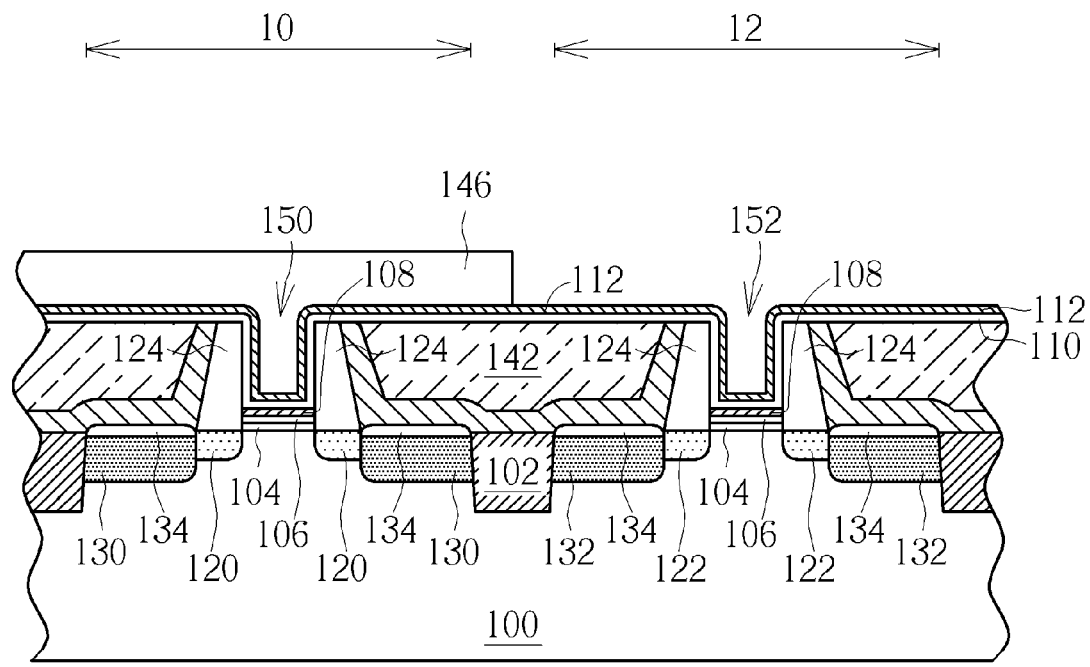

Please refer to FIG. 6. A photolithographic process is carried out to form a patterned photoresist layer 146 on the substrate 100. The patterned photoresist layer 146 may have a single-layered or a multi-layered structure and can expose the first work function layer 112 in the second region 12. Then, a suitable etchant is used to remove the first work function layer 112 not covered by the patterned photoresist layer 146 to expose the etch stop layer 108 in the second gate trench 152. During the removing step of the first work function layer 112, the etch stop layer 108 is used to prevent the underneath barrier layer 108 and gate dielectric layer 106 from being further etched.

Figure 7:
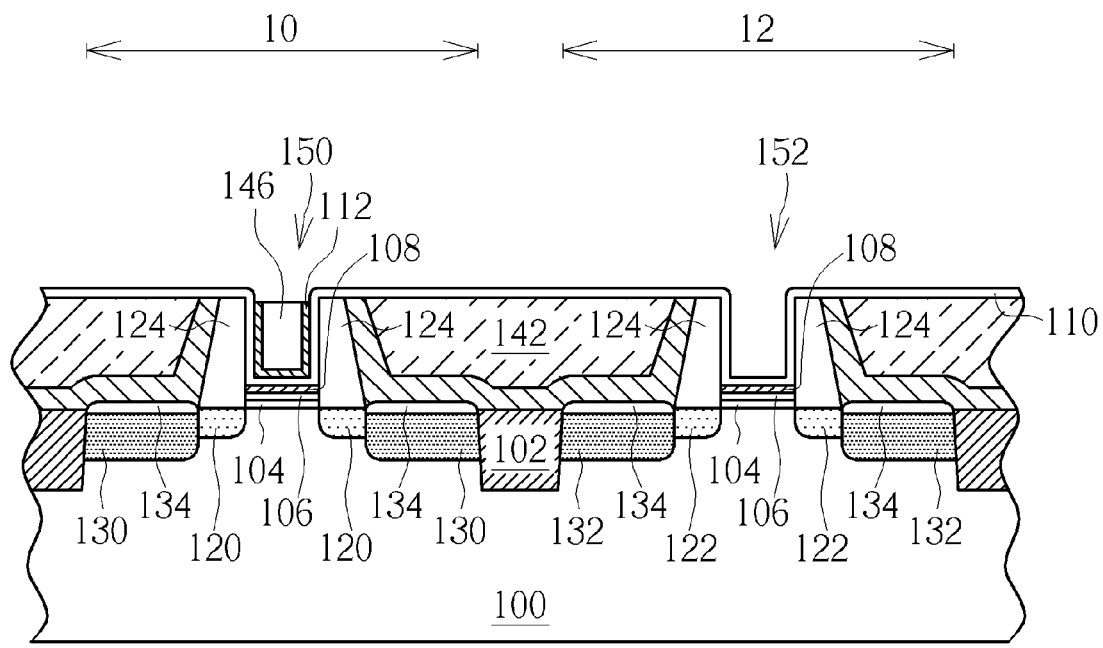
Figure 8:
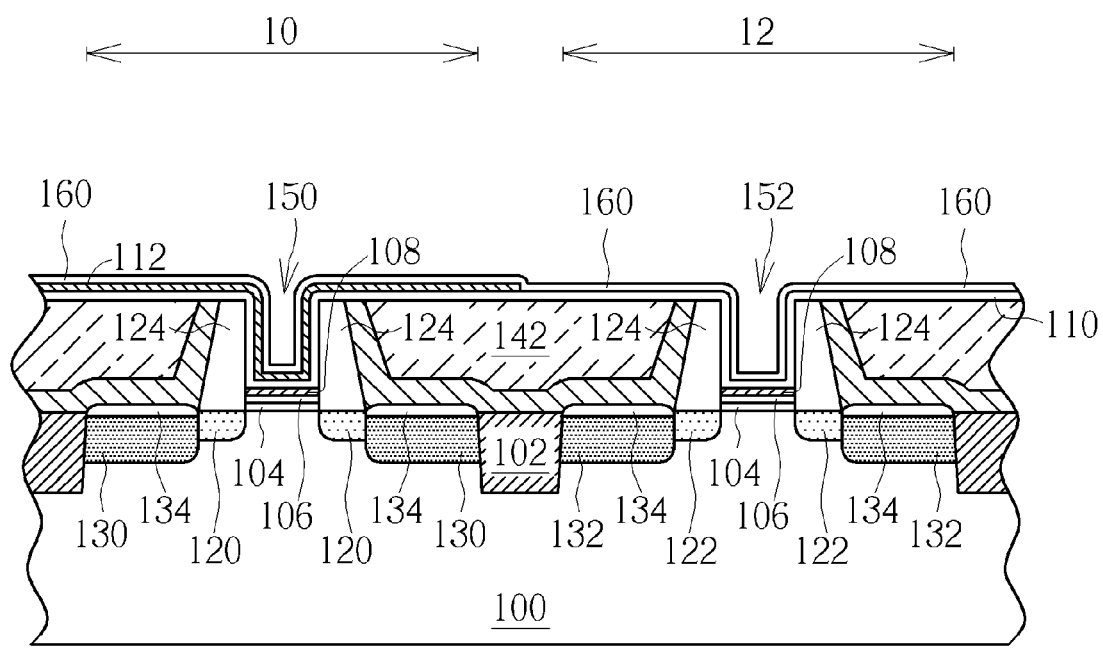

Besides, please refer to FIG. 7. It is worth noting that in order to improve the gap-filling result of the following formed metal materials, the patterned photoresist layer 146 can be only formed in the first gate trench 150, and the surface of the patterned photoresist layer 146 is lower than the opening of the first gate trench 150. Accordingly, during the subsequent etching processes for removing the first work function layer 112 inside the second gate trench 152, the first work function layer 112 near the opening of the first gate trench 150 can also be trimmed or removed concurrently. Accordingly, the remaining first work function layer 112 is left only in the first gate trench 150, particularly on the bottom and sidewalls of the first gate trench 150. This means that a height of the remaining first work function layer 112 is lower than a depth of the first gate trench 150. Consequently, the gap-filling result of the following formed metal materials can be improved.

Please refer to FIG. 7. After removing the first work function layer 112 from the second gate trench 152, a CVD process or a PVD process is performed to form a second work function layer 160 on the substrate 100. The second work function layer 170 includes a predetermined work function that is corresponding to the conductivity type of the second region 12. This means that the second work function layer 160 is an N-type work function layer having a work function between 3.9 eV and 4.2 eV. Additionally, the second work function layer 160 can be a single-layered structure or a multi-layered structure. In the preferred embodiment, the second work function layer 160 can be a metal layer, and preferably a TiAl layer formed through a CVD process or a PVD process.

Figure 9:
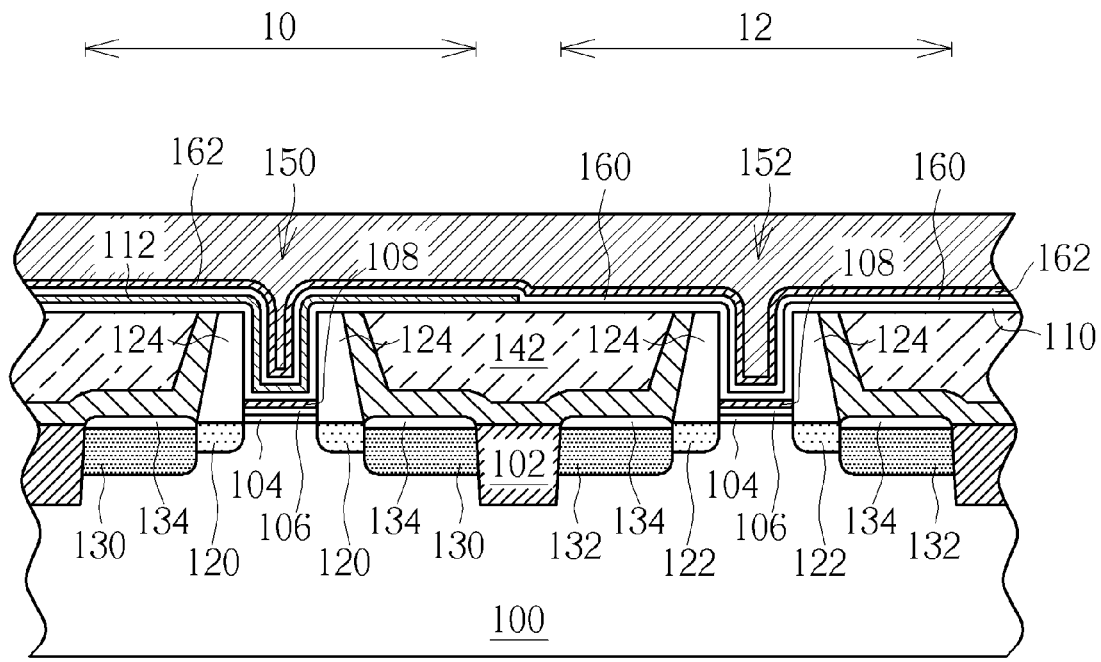

Then, as shown in FIG. 9, an optional top barrier layer 162 and a metal layer 170 with low resistance are formed in sequence above the second work function layer 160 in the first gate trench 150 and the second gate trench 152. They may be composed of TiN or TaN and may be used to improve the adhesivity and the filling ability of the metal layer, or to prevent the electromigration or the thermal diffusion of the elements in the metal layer. The metal layer 170 may be selected from metals or metal oxides with superior filling ability and/or low resistance, such as aluminum (Al), titanium aluminum (TiAl), titanium aluminum oxide (TiAlO), tungsten (W) or copper (Cu), but not limited thereto, which can respectively fill up the first gate trench 150 and the second gate trench 152.

Figure 10:
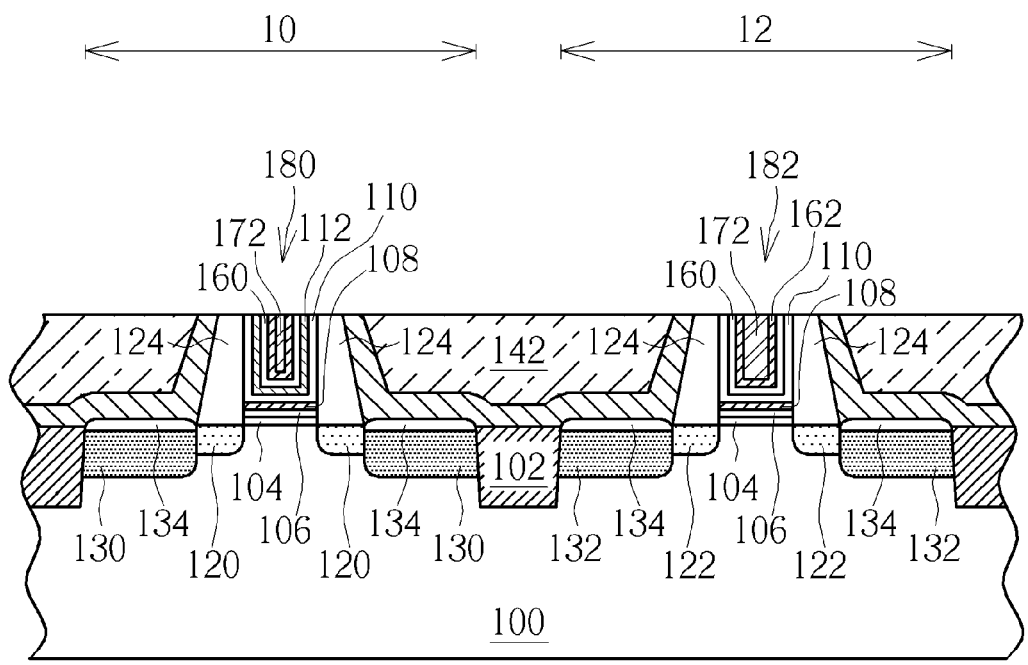

Please refer to FIG. 9 and FIG. 10. A planarizing process, such as a chemical mechanical polishing (CMP) process is finally performed to remove the layers above the interlayer dielectric, such as the unnecessary metal layer 170, the top barrier layer 162, the second work function layer 160, the first work function layer 112, and the etch stop layer 108. Consequently, a gate metal layer 172 is formed in each first gate trench 150 and the second gate trench 152. Accordingly, a first metal gate structure 180 and a second metal gate structure 182 are respectively formed in the first region 10 and the second region 12. In this embodiment, only the first metal gate structure 180 has a silicon-containing work function layer. In addition, the ILD layer 142 and the CESL 140 can be optionally removed and sequentially reformed on the substrate 100 to improve the performances of the semiconductor devices in the preferred embodiment.

To summarize, according to the manufacturing method of a metal gate structure provided by the present invention, a silicon-containing work function layer is provided in a P-type semiconductor device. Compared with a method which uses nitrogen or oxygen to adjust the work function of a P-type work function layer, the silicon-containing work function layer can improve the electrical performances of the transistor device, such as increasing the flat bend voltage ($V_{fb}$) and decreasing the EOT, without increasing the gate leakage current ($J_g$). In other words, the manufacturing method for a metal gate provided by the present invention ensures the P-type semiconductor device achieves a metal gate having a work function fulfilling its requirement and thereby ensuring good performances of the P-type semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A metal gate structure, comprising:
a gate dielectric layer;
a conductive metal layer, disposed on the gate dielectric layer; and
a silicon-containing work function layer having a U-shaped profile, disposed between the gate dielectric layer and the conductive metal layer, wherein the silicon-containing work function layer comprises a vertical portion and a horizontal portion, wherein an atomic percentage of silicon in the silicon-containing work function layer is between 10% and 30%.

2. The metal gate structure according to claim 1, further comprising a barrier layer disposed between the gate dielectric layer and the silicon-containing work function layer, wherein a composition of the barrier layer comprises titanium nitride.

3. The metal gate structure according to claim 2, further comprising an etch stop layer disposed between the barrier layer and the silicon-containing work function layer, wherein a composition of the etch stop layer comprises tantalum nitride.

4. The metal gate structure according to claim 1, wherein a work function of the silicon-containing work function layer is greater than 4.9 electron volts (eV).

5. The metal gate structure according to claim 1, wherein a composition of the silicon-containing work function layer further comprises titanium and an atomic ratio of titanium to silicon in the silicon-containing work function layer is between 1.5 and 4.

6. The metal gate structure according to claim 1, wherein a composition of the silicon-containing work function layer further comprises oxygen.

7. The metal gate structure according to claim 6, wherein an atomic ratio among titanium, silicon, nitrogen, and oxygen in the silicon-containing work function layer is 28.9:13.2:46.8:10.

* * * * *